(12) United States Patent
Robinson et al.

(10) Patent No.: US 7,626,893 B2
(45) Date of Patent: Dec. 1, 2009

(54) TIMER SWITCH

(75) Inventors: Nathaniel Robinson, Linköping (SE); David Nilsson, Mantorp (SE); Magnus Berggren, Vreta Kloster (SE)

(73) Assignee: ACREO AB, Kista (SE)

( * ) Notice: Subject to any disclaimer, the term of this patent is extended or adjusted under 35 U.S.C. 154(b) by 532 days.

(21) Appl. No.: 11/415,425

(22) Filed: May 2, 2006

(65) Prior Publication Data
US 2006/0261676 A1 Nov. 23, 2006

(30) Foreign Application Priority Data
May 2, 2005 (EP) ................... 05103647

(51) Int. Cl.
G04F 8/00 (2006.01)
H01G 9/00 (2006.01)
(52) U.S. Cl. ...................... 368/114; 361/501
(58) Field of Classification Search ............... 368/107, 368/114, 327; 361/435, 501; 374/102, 103; 204/248, 278, 400, 411, 412; 257/253
See application file for complete search history.

(56) References Cited

U.S. PATENT DOCUMENTS

| 3,357,911 | A | * | 12/1967 | Gruner et al. ............... 368/114 |
| 3,544,852 | A | | 12/1970 | Giles |
| 3,544,853 | A | | 12/1970 | Giles |
| 3,753,110 | A | | 8/1973 | Ikeda et al. |
| 3,768,015 | A | * | 10/1973 | Moser ........................ 368/114 |
| 4,084,511 | A | * | 4/1978 | Svrjcek, Jr. .................. 361/435 |
| 4,103,296 | A | * | 7/1978 | Hart et al. .................... 368/114 |
| 4,860,269 | A | * | 8/1989 | Hennings et al. ............ 368/114 |
| 6,198,701 | B1 | | 3/2001 | De Jonghe et al. |
| 2004/0211989 | A1 | | 10/2004 | Armgarth |

FOREIGN PATENT DOCUMENTS

| DE | 1 933 204 | 1/1971 |
| GB | 2324611 | 10/1998 |

OTHER PUBLICATIONS

Search Report dated Jan. 21, 2008 for corresponding European Application No. 06113406.

* cited by examiner

Primary Examiner—Matthew V Nguyen
Assistant Examiner—Jue Zhang
(74) Attorney, Agent, or Firm—Harness, Dickey & Pierce, P.L.C.

(57) ABSTRACT

The present invention provides an electrochemical timer device (110) having a source (101) and a drain (102) contact. The device further comprises a switch channel (104) and a delay reservoir (103) that are electrochemically interconnected with a gate electrode (105). The switch channel (104) interconnects the source (101) and drain (102) contacts and is arranged to change electrical conductivity upon electrochemistry therein, and an electrochemical reaction is arranged to occur in the gate electrode (105) and delay reservoir (103) upon application of a drive voltage there between. The delay reservoir (103) is arranged such that the electrochemical reaction occurring therein gradually moves towards the switch channel (104) and eventually reaches the switch channel (104) after a delay time thereby changing the electrical conductivity of the switch channel (104).

30 Claims, 5 Drawing Sheets

TIMER SWITCH

PRIORITY STATEMENT

This application claims benefit of priority under 35 U.S.C. §119 from European Patent Application No. 05103647.3 filed on May 2, 2005, in the European Patent Office, the disclosure of which is incorporated herein by reference in its entirety.

FIELD OF THE INVENTION

The present invention relates to electrochemical timer switch devices and methods of controlling the same.

TECHNOLOGICAL BACKGROUND

Electrochemical devices are attracting much focus within a large area of applications. Envisaged application areas include security devices, food quality indicators, parking tickets, timers for medical compliance packaging, etc. One particular area that is currently attracting much focus is the prospect of providing low cost, easily applied electronic circuits on plastic and paper-based packages of various kinds. For example, such circuits are envisioned for providing information such as age, handling history, current status etc. of the content of such a package.

In order to provide for such functionality, circuits typically need to include conventional electronic components such as transistors, resistors, capacitors, display cells etc. These components all need to be cheap, environmentally friendly, and preferably possible to manufacture using conventional manufacturing processes such as printing equipment.

Using such components, logical and analogue circuits can be designed as described, for example, in US-20040211989. One component that is desirable for a large number of applications is a timer that opens or closes a circuit at a predetermined point in time. Such a timer switch can indeed be provided using conventional arrangements in line with the teachings of US-20040211989, for example using ring oscillators in combination with other logic. However, such arrangements require complex circuit design and typically suffer from slow switch characteristics (i.e. switching from open to closed or from closed to open occurs gradually during an extended period of time). Hence, such arrangements are undesirably complicated and unreliable and there is thus a need for a low-cost and reliable timer switch that is suitable for use in combination with electrochemical components based on conducting organic materials.

SUMMARY OF THE INVENTION

The present invention meets the above need by providing a method of controlling a switch channel according to claim 1 and an electrochemical switch according to claim 8 and 19. Advantageous embodiments of the present invention are defined in the appended sub-claims.

According to a first aspect thereof, the present invention provides a method of delaying switching of an electrochemical switch channel. The switch channel comprises electrochemically active material, it electrically connects a source electrode to a drain electrode and it is in contact with a delay reservoir comprising electrochemically active material. Said method comprises a first step of applying a potential across an electrolyte, which electrolyte ionically connects both said delay reservoir and said switch channel to a gate electrode, such that an electrochemical reaction between said delay reservoir and said gate electrode is initiated. Said method also comprises a second step of maintaining a potential across said electrolyte such that a reaction front of said electrochemical reaction first porpagates in said delay reservoir until said front reaches said switch channel, before said electrochemical reaction alters the electrical conductivity of said switch channel such that it switches.

According to a second aspect thereof, the present invention provides an electrochemical switch for delayed switching. Said electrochemical switch comprises a source contact, a drain contact and a switch channel. The channel comprises electrochemically active material and is arranged to electrically connect said source contact to said drain contact. Said electrochemical switch further comprises a delay reservoir of electrochemically active material, which channel is arranged in contact with said switch channel. Moreover, said channel comprises a gate electrode, and an electrolyte ionically connecting both said switch channel and said delay reservoir to said gate electrode. Additionally, said switch channel comprises means for applying a potential across said electrolyte such that an electrochemical reaction between said delay reservoir and said gate electrode is initiated. Said switch channel also comprises means for maintaining a potential across said electrolyte such that a reaction front of said electrochemical reaction first porpagates in said delay reservoir until said front reaches said switch channel, before said electrochemical reaction alters the electrical conductivity of said switch channel such that it switches.

According to a third aspect of the present invention, an electrochemical timer switch is provided that comprises: a source contact; a drain contact; a gate electrode; an electrochemically active element defining a delay reservoir and a switch channel; and an electrolyte that is in contact with the electrochemically active element and the gate electrode such that it facilitates an electrochemical reaction between the electrochemically active element and the gate electrode. Furthermore the switch channel is arranged between and in direct electrical contact with the source and drain contacts and comprises an organic material that has the ability of electrochemically altering the electrical conductivity in response to the electrochemical reaction. The delay reservoir is arranged such that it separates the switch channel from the gate electrode and thereby prevents the switch channel from participating in the electrochemical reaction unless the delay reservoir is first electrochemically reacted to a predetermined extent.

In a sense, the delay reservoir serves as a buffer that protects the switch channel from participating in the electrochemical reaction. Hence, when a drive voltage is applied to the gate electrode, the electrochemical reaction will be restricted to the delay reservoir, leaving the switch channel essentially unaffected until the delay reservoir is reacted to the predetermined extent. In other words, the electrical conductivity of the switch channel is normally maintained until it is altered by the electrochemical reaction initiated in the delay reservoir, which alteration occurs after the delay reservoir has been reacted to said predetermined extent. In yet other words, if a first electrical conductivity of the switch channel is provided, said delay reservoir preferably prevents said switch channel from switching at least until a front of said electrochemical reaction, propagating in said delay reservoir, reaches said switch channel. Hence, said first electrical conductivity is substantially maintained until said electrochemical reaction switches said switch channel. Moreover, said predetermined extent typically corresponds to the delay reservoir being more or less fully reacted. For example, the electrochemical reaction may first occur in a region of the delay reservoir close to the gate electrode and may subsequently extend gradually in a direction towards the switch cannel. According to this example, the switch channel is essentially unaffected until the reaction front reaches the switch channel.

In effect, depending on its electrochemical state, the switch channel provides electrical contact between the source and drain contacts or isolates them electrically from each other, i.e. provides low electrical conductivity between said source and drain contacts, and the delay reservoir serves to delay an electrochemical reaction initiated in said delay reservoir from occurring in the switch channel. Thereby the switch channel operates as a timer switch by altering its electrical conductivity only after a predetermined time delay, that is equal to the time it takes for the delay reservoir to react electrochemically to the predetermined extent defined above.

With respect to this invention the term electrochemically active element refers to a device which comprises both said switch channel and said delay reservoir.

With respect to the invention, the term switching of an electrochemically active material refers to a substantial alteration or change of the electrical conductivity of said material, i.e. that the electrical conductivity is altered by at least 50%, and preferably more. In other words, if the switch channel has an electrical conductivity of 0.1 S/cm, it is considered to have been switched if the conductivity of the switch channel is changed to 0.05 S/cm or less, and to 0.15 S/cm or more, respectively.

A switching of said switch channel is different from the change in electrical conductivity which might occur when a potential is initially applied across the electrolyte of a timer switch, and which effectuates the formation of an electric field across said switch channel for the first time. With respect to this invention, the switch channel has an initial conductivity before said potential is applied across said electrolyte. It is believed that as the potential is applied, the electrical conductivity of the switch channel might change slightly, from said initial electrical conductivity to a first electrical conductivity. If this change in conductivity occurs, said first electrical conductivity is believed to be reached shortly after a first electric field has stabilized across said switch channel, as a response to said potential which is applied across said electrolyte. In other words, when said potential is applied across said electrolyte a first electric field across said switch channel is formed, and at least substantially at the moment said electric field has stabilized a first electrical conductivity of said switch channel is provided. In yet other words, the application of said potential across said electrolyte might further comprise initiating a change of conductivity at said switch channel, form said initial electrical conductivity to said first electrical conductivity, at the moment said potential is applied across said electrolyte. The change in electrical conductivity is usually between 1% and 10% compared to the initial electrical conductivity, provided it occurs. With respect to this invention, the term initiation phase refers to the time interval during which this change of electrical conductivity possibly occurs, and the electric fields effecting the timer switch are stabilised. The duration of the initiation phase is short and normally in the order of seconds. Moreover, the term initiation phase is to be interpreted such, that said first electrical conductivity of said switch channel is provided no later than immediately after said initiation phase. However, it is more likely that this change of electrical conductivity will occur for an electrochemically active material which is in its conducting state, than for one which is in its non-conducting state. With respect to this invention, if no change occurs said first conductivity equals said initial conductivity of said switch channel.

Whether said front of said electrochemical reaction starts propagating in said delay reservoir towards said switch channel, before said first electrical conductivity of said switch channel is provided, or vice verse, (i.e. whether said first electrical conductivity of said switch channel is provided before said front of said electrochemical reaction starts propagating in said delay reservoir towards said switch channel), is determined by the specific choice of electrochemically active material for said switch channel, said delay reservoir in combination with the choice of electrolyte.

As have been stated above, the delay reservoir serves to delay switching of the switch channel a substantial amount of time. However, once the switch channel switches, the electrical conductivity thereof changes rapidly and substantially. Hence, switching of the timer device can be divided into two phases, a delay phase and a switching phase. During the delay phase, the electrochemical reaction is restricted to the delay reservoir and does not essentially affect the switch channel. During the switching phase, the electrochemical reaction works primarily on the switch channel and thereby changes the electrical conductivity of the switch channel in a step-like fashion. According to the present invention the delay reservoir provides for the delay phase and hence provides a substantial delay time during which the electrical conductivity between the source and drain contacts is essentially unaffected while at the same time confining the actual switching of the switch channel to a short instant. Consequently, the delay time is substantially longer than the switching time.

The ratio between the delay time and the switching time is typically 10:1 or higher. According to one embodiment, the ratio is at least 100:1. The existence and magnitude of this ratio is, in a sense, what gives the timer device its fundamental timer characteristic. In comparison, a transistor device is designed to switch as quickly as possible and the existence of anything similar to a delay phase would deteriorate its performance completely. Furthermore, even though switching of an electrochemical transistor might be slowed down by increasing its size or by using less conducting materials, such modifications would not give the device timer characteristics. Rather, any such modification would only address the switching speed (i.e. the length of the switching phase) and would not introduce a delay phase. Furthermore, such modifications would generally introduce substantial dependencies in regard to environmental changes, since the characteristics of such low conducting materials (and thus the switching characteristics of such a device) typically depend heavily on environmental parameters like humidity and temperature.

According to the present invention it is the delay reservoir that gives the timer its timer characteristics. The delay reservoir can be defined as the portion of the electrochemically active element whose electrical conductivity does not essentially affect the overall conductivity between the source and drain contacts. The switch channel can be defined as the remaining portion of the electrochemically active element, whose electrical conductivity essentially affects the conductivity between the source and drain contacts.

Introduction of the delay reservoir thus provides a conceptually different operation compared to, for example, the transistors disclosed in US-20040211989. The transistors structures disclosed therein are optimized to have a very rapid response time. This is achieved by eliminating any material that might serve to delay the electrochemical reaction.

The change of electrical conductivity occurring in the switch channel can be either a change from low to high conductivity or a change from high to low conductivity, depending on the design of the device and on the materials used. The present invention thus provides a switch that either opens or closes an electrically conductive link between the drain contact and the source contact. This opening or closing occurs after a predetermined time delay that is governed by the delay reservoir. In operation, the gate electrode is simply connected to a voltage supply that gives rise to electrochemistry occurring in the delay reservoir.

As is obvious for the skilled man, the entire electrochemically active element, including the switch channel, might participate in the electrochemical reaction to some minor extent even before the delay reservoir is sufficiently electrochemically reacted or reacted to said predetermined extent. However, according to the present invention, any such participation is below the degree of electrochemical reaction needed to substantially change the conductivity of the switch channel. A substantial change of conductivity is to be interpreted as a change in conductivity that is meaningful for the operation of the timer switch. For example, the conductivity of the switch channel may change <5% before the delay reservoir sufficiently reacted, and may change tens or hundred of times once the threshold is reached. As stated above, a substantial change of electrical conductivity is therefore to be interpreted as an alteration of the electrical conductivity of at least 50%, and preferably as a substantially larger alteration such as of at least 1,000% or at least 10,000%.

The time delay provided by the present invention is thus based on an initial electrochemical reaction confined in the delay reservoir. In order to improve the operation of the switch, it is found advantageous to use an electrolyte that has a lower ionic conductivity than the electrical conductivity of the delay reservoir. In this context, the ionic conductivity of the electrolyte should be interpreted as ionic charge carrying capacity, whereas the electrical conductivity of the delay reservoir should be interpreted as electronic charge carrying capacity. Using such a low conductivity electrolyte, the electrochemical reaction will occur in a reaction front, travelling from the edge nearest the gate electrode towards the switch channel. Hence, according to one embodiment the delay reservoir has an electronic electrical conductivity, and the electrolyte has an ion electrical conductivity that is lower than the electron electrical conductivity of the delay reservoir, such that the electrochemical reaction is forced to occur gradually in a reaction front travelling in said delay reservoir from said gate electrode towards said switch channel. Basically, in such a device, the reaction front will travel in the delay reservoir towards the switch channel at the same speed that essentially all of the delay reservoir material behind the reaction front is "consumed" by the electrochemical reaction on its way towards the switch channel. In other words, the reaction front will travel at a speed substantially equal to the rate at which all of the delay reservoir material behind the reaction front is "consumed". This effect is caused by the charge carriers, driving the electrochemical reaction, preferring to travel in the delay reservoir rather than in the electrolyte, and thereby preferring to perform electrochemistry as close to the gate electrode as possible. However, when the material closest to the gate electrode is consumed the charges gradually have to travel a longer distance in the electrolyte. In fact, the bigger the difference in charge carrying capacity the more distinct the front will be.

The above reasoning applies also to arrangements where the electrolyte is included in the electrochemically active material. In this context, an electrolyte should be interpreted as a media that is ion conductive. Some materials provide for both ion conductivity and electron conductivity and hence do not require any separate electrolyte to be applied.

According to one embodiment, the electrolyte is arranged in a layer on the gate electrode and the electrochemically active element. This is advantageous, for example, in case printing techniques are employed as mentioned above. In such case, the electrolyte can be selectively applied in a separate or parallel manufacturing step using the same or similar equipment. The thinner this layer of electrolyte is made, the lower the total ionic conductivity of the electrolyte, which is preferable in order to achieve a larger difference between the ionical conductivity of the electrolyte and the electrical conductivity of the electrochemically active material.

Alternatively, the electrolyte can be arranged as an integral part of the gate electrode and electrochemically active element, for example in the form of electrolyte particles dispersed in a polymer matrix of the respective components. This is advantageous for some applications since it eliminates the need for a separate electrolyte to be applied, thereby simplifying manufacture by eliminating a manufacturing step. However, the gate electrode and the delay reservoir should be bridged by a material that conducts ions much better than electrons in order to promote an electrochemical reaction. Most preferably, said electrolyte should conduct ions but not electrons.

According to the present invention, the delay reservoir can be interpreted as the part of the electrochemically active region whose electrical conductivity does not affect the electrical conductivity between the source and drain contacts. The delay reservoir typically has a substantially larger volume than the switch channel, thereby ensuring a substantial delay time and also a relatively short response time in the switch channel once the electrochemical reaction has progressed through the delay reservoir to the switch channel.

According to some embodiments, the volume ratio between the delay reservoir and the switch channel is above 10:1, 100:1, 1000:1, or 10000:1.

Comparing the timer switch in accordance with the present invention with the electrochemical transistors previously described in US-20040211989, the transistors described therein are optimized for giving an immediate switching response to an applied gate voltage. This is achieved by minimizing any material that needs to switch electrochemical state in order change the impedance of transistor channel that interconnects the source and drain contacts. In particular, any material that must switch before switching of the actual transistor channel is eliminated. According to the present invention, and in contrast to the above transistor, the idea is instead to delay the response of the channel a substantial amount of time. This is achieved by the addition of the delay reservoir, which operates as a delay element for delaying the response of the switch channel. The application of such a delay reservoir is in direct contradiction with the aim of the above mentioned transistor, since it deteriorates the immediate transistor response completely.

Furthermore, the electrolyte should preferably have a restricted ion conductivity thereby slowing down the electrochemical reaction and thus lengthening the delay time.

In addition, while the transistor's channel is defined by where the electrolyte is placed, the timer switch in accordance with the present invention is instead defined by where the delay reservoir is patterned (i.e. arranged), and also by the relative size, shape and position of the delay reservoir, the electrolyte and gate electrode, respectively. When the electrolyte is arranged such that it does not cover the whole of the electrochemically active material of the delay reservoir, an electrochemical reaction initiated in said delay reservoir will propagate mainly in the portion of said delay reservoir which is in contact with said electrolyte. However, the front of the electrochemical reaction will normally also spread into surrounding portions of said delay reservoir, which are not covered by any electrolyte. In most cases, the propagation rate of the front of said electrochemical reaction is faster in the portion of said delay reservoir which is covered by said electrolyte, compared to in a portion of the delay reservoir which is not covered by electrolyte. A first and a second timer switch are compared. The only difference between the two switches is that the electrolyte of said first timer switch covers the whole of said delay reservoir, whereas the electrolyte of said second timer switch only covers half of said delay reservoir. The electrolyte of said first and said second timer switch, respectively, both extends continuously from said gate electrode to said switch channel. In operation, the front of the electrochemical reaction propagating in the delay reservoir of said second timer switch will reach its respective switch channel faster, than the front of said electrochemical reaction propagating in the delay reservoir of said first timer will reach its respective switch channel.

In a device that provides for an electrochemical reaction front as described above, the extent to which the delay reservoir has to be electrochemically reacted before any electrochemical reaction occurs in the switch channel essentially corresponds to the electrochemical reaction front reaching the switch channel. In other words, the electrochemical timer switch switches once the electrochemical reaction front travelling or propagating in the delay reservoir reaches the switch channel. In case the electrochemically active element comprises electrochromic material that changes optical appearance upon electrochemistry the electrochemical reaction front might actually be visible, thereby giving an optical readout of the position of the reaction front. Thereby, it is possible to follow the progress of the reaction front and to anticipate the switching of the switch channel.

The electrochemical reaction occurring in the electrochemically active element can be either a reduction or an oxidation. Hence, according to one embodiment, the switch channel has the ability of altering its electrical conductivity through reduction thereof. According to an alternative embodiment, the switch channel has the ability of altering electrical conductivity through oxidation thereof.

As stated above, the switch channel comprises a material having the ability to electrochemically altering its electrical conductivity. The material can, for example, be an electrically conductive polymer suitable for application through conventional printing processes. The electrically conductive polymer might be a polymer, a copolymer, or mixture of polymers, and can optionally comprise additional, non-organic compounds such as metallic particles. Alternatives to electrically conductive polymers include various metal oxides and other molecules that can be switched between a low-conducting state and a high-conducting state.

Even though the delay reservoir is electrochemically active as well, it does not necessarily have the ability of electrochemically altering its electrical conductivity. However, the delay reservoir and the switch channel are both part of the electrochemically active element and are therefore conveniently formed out of the same material.

Furthermore, according to yet one embodiment, all of the source and drain contacts and the electrochemically active element are formed as an integral unit by one and the same material.

The use of electrically conductive polymers is advantageous in that they are easy to process and thus enable, for example, conventional printing techniques to be used for creating the respective components. According to one embodiment, the source contact, drain contact, and electrochemically active element are all arranged in one common plane on a carrier substrate. This arrangement is particularly advantageous since it enables roll-to-roll printing techniques and thereby makes possible large-scale, low-cost manufacturing. To further simplify manufacturing the gate electrode can be formed out of electrically conductive polymer as well, thereby enabling the same manufacturing method to be used for the gate electrode as well. Hence, according to one embodiment, the gate electrode is formed out of an electrically conductive polymer. That polymer is advantageously the same polymer used for the source and drain contacts and the electrochemically active element.

Preferably, said switch channel, said delay reservoir and said gate electrode are all formed of a respective layer comprising electrochemically active material, which layers are arranged on a carrier substrate.

As described above, the electrochemical reaction is driven by a voltage applied to the gate electrode. The polarity thereof depends on the desired electrochemical reaction. A positive gate voltage gives rise to reduction in the electrochemically active element, and a negative voltage gives rise to oxidation in the electrochemically active element. Application of the electrochemical drive voltage requires a counter electrode that is electrically interconnected with the electrochemically active element. Therefore, according to one embodiment, the timer switch further comprises a counter electrode that is electrically connected to the electrochemically active element but that is separate from the source and drain contacts. According to an alternative setup, one of the source and drain contacts is used also as counter electrode, thus eliminating the need for an additional, separate counter electrode.

The electrochemical timer switch provided by the present invention is advantageous since it provides a low-cost, dependable timer that can be used in combination with, for example, different types of displays (such as LED's, electrophoretic displays or electrochromic displays), logic circuits (e.g. based on electrochemical transistors), and various battery cells. In fact, the timer switch is particularly advantageous since it can be manufactured using the same equipment and materials as used for manufacturing electrochemical transistors and displays etc.

According to one aspect the present invention is based on the use of electrically conductive polymers that are patterned, cut or formed to a desired configuration. Hence, in a sense, it is the pattern or shape of the polymer in combination with the electrolyte that defines characteristics of the timer switch. This is advantageous since it facilitates straightforward tuning of the characteristics simply by changing the layout of the polymer pattern.

Another advantage of the present invention is the ability to arrange additional sets of switch channels and drain contacts, each such set having individual switching characteristics. Hence, according to one embodiment, the electrochemical timer switch comprises a second drain contact and the electrochemically active element comprises a second switch channel that separates the second drain contact from the source contact. In effect, there are two drain contacts, each one having its own switch channel and thereby having an individual switching and delay time. The two switch channels can, for example, be arranged in series such that a first of them is totally switched before the electrochemical reaction continues to the second switch channel. In such case, the first switch channel in effect operates as an extension of the delay reservoir in respect to the second switch channel.

Furthermore, the timer can be used in sensor applications by employing an electrolyte that changes its ionic conductivity upon exposure to different analytes. In such case, the duration of the time delay will depend on the environment to which the electrolyte is exposed.

BRIEF DESCRIPTION OF THE DRAWINGS

In the following, embodiments of the present invention will be further described with reference to the accompanying, exemplifying drawings on which.

DETAILED DESCRIPTION OF EMBODIMENTS OF THE INVENTION

Figure 1A:
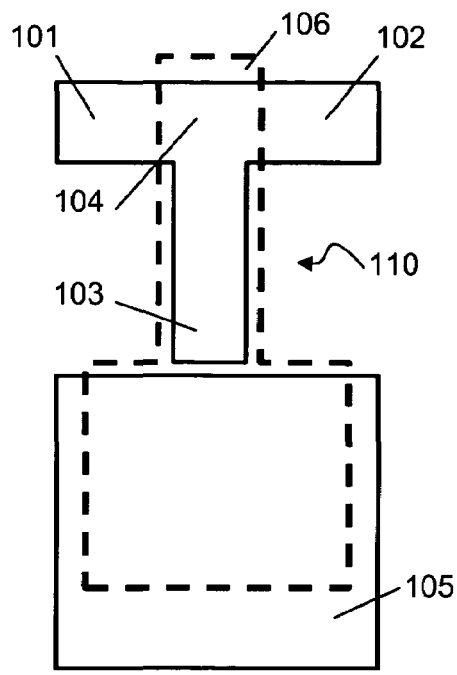
FIG. 1a-c illustrates top views of different layouts of the timer device in accordance with the present invention.

FIG. 1a illustrates a general embodiment of an electrochemical timer device 110 in accordance with the present invention. The timer device 110 comprises a source contact 101, a drain contact 102, a delay reservoir 103, a switch channel 104, and a gate electrode 105. However, the device 110 is symmetrical in the sense that the source contact 101 and the drain contact 102 are interchangeable. Hence, the actual operation of the two contacts 101 and 102 is determined by the circuitry in which the device operates (i.e. by the voltages applied to the respective contact).

Said source contact 101, drain contact 102, delay reservoir 103 and switch channel 104 together forms a T-shaped element. Said T-shaped element comprises one centre member and three elongated members. Said centre member corresponds to said switch channel, a first elongated member of the T-shaped element corresponds to said source contact 101, a second elongated member corresponds said drain contact 102 and a third elongated member corresponds to said delay reservoir 103. All three elongated members are arranged in contact with said centre member, and said first member I extends in a first direction from said centre member. Said second member extends in a second direction reverse to said first direction, and said third member extends in a direction substantially orthogonal to said first and second direction. Hence, said switch channel, said source contact, said drain contact and said delay reservoir substantially describes a T. In this embodiment said electrolyte is arrange such that it covers the whole of said delay reservoir 103, said switch channel 105 and a major portion of said gate electrode 105.

The delay reservoir 103 and the switch channel 104 together form an electrochemically active element that is susceptible for electrochemical reaction. The device 110 is furthermore covered with a layer of electrolyte 106 (edges of the electrolyte are indicated with a dashed line). The electrolyte 106 covers the electrochemically active element 103, 104 and the gate electrode 105, thereby enabling an electrochemical reaction between the electrochemically active element 103, 104 and the gate electrode 105. Due to the arrangement of the delay reservoir 103 any electrochemical reaction occurring in the electrochemically active element will be restricted to the delay reservoir 103 until the delay reservoir is reacted to a predetermined extent.

Figure 1B:
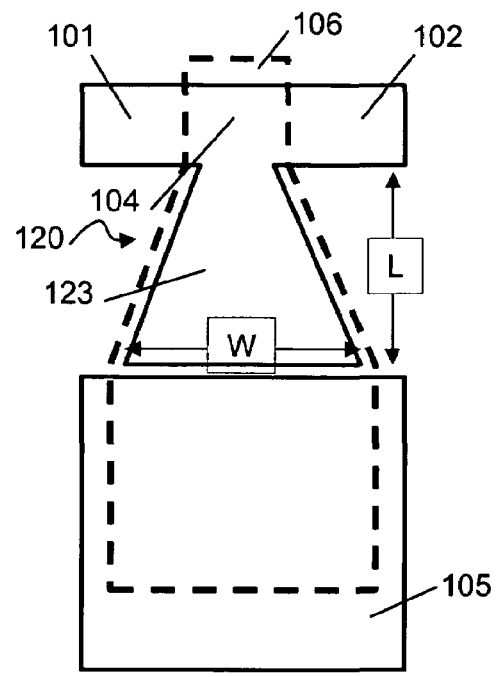

Embodiment 110 illustrated in FIG. 1a is only one out a vast number of feasible device layouts. FIG. 1b illustrates another embodiment 120, this embodiment is equal to the embodiment shown in FIG. 1a, except that the delay reservoir 123 has a gradually decreasing width W. In other words, the delay reservoir has a substantial triangular shape, wherein a corner of the triangle facing said switch channel has been cut off. A delay reservoir 123 having a gradually decreasing width W facilitates a linear relation between the delay time of the device and the length L of the delay reservoir 123. Apart from the different delay reservoir layout, the remaining components of the device 120 are equal to corresponding components of device 110 and are denoted with the same reference numbers.

Figure 1C:
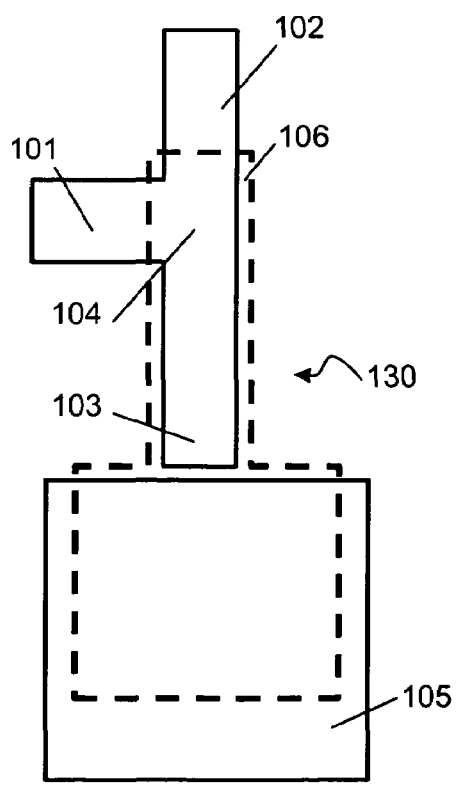

Yet another alternative embodiment 130 is illustrated in FIG. 1c. Device 130 comprises all the components of device 110, each being denoted with the same reference numbers. However, the drain contact 102 is arranged at an angle in respect of the source contact 101. In other words, instead of extending in said second direction, said second element extends in a fourth direction orthogonal to said first direction, and reverse to said third direction. This layout thus provides a device having a different foot-print which may be advantageous for certain applications depending on the layout of the surrounding circuitry. In fact, depending on the application at hand there are numerous alternative layouts for the gate electrode and source and drain contacts. Apart from the foot-print, device 130 can also provide for a shorter switch time and/or a different switch characteristics since the electrochemical reaction front will progress differently in switch channels having different configurations.

Figure 2:
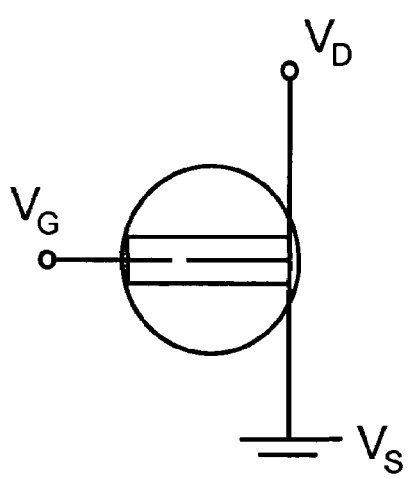
FIG. 2 illustrates a proposed symbol for use in circuitry diagrams.

FIG. 2 illustrates a proposed symbol for use in circuitry diagrams, corresponding to the devices illustrated in FIGS. 1a, 1b, and 1c. In the symbol, $V_G$ corresponds to the gate electrode, $V_S$ corresponds to the source contact, and $V_D$ corresponds to the drain contact.

In the devices described above, one of the source and drain contacts are typically used as counter electrode driving the electrochemical reaction. In other words, the drive voltage for driving the electrochemical reaction is typically applied between the gate electrode and one of the source and drain contacts.

Figure 3:
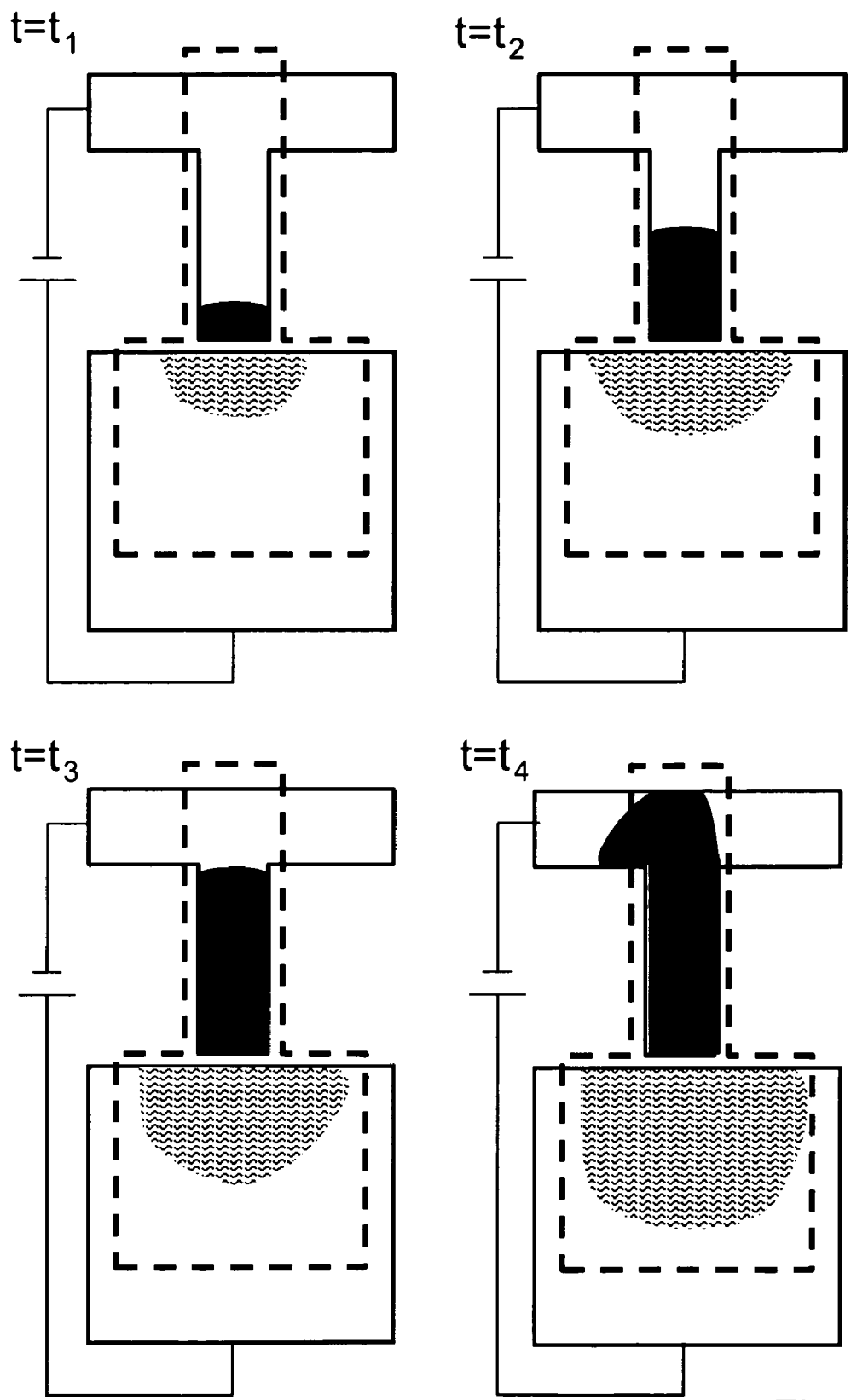
FIG. 3 illustrates the progress of an electrochemical reaction front in a timer device in accordance with the present invention.

Depending on the arrangement of the source and drain contact and the delay reservoir, the electrochemical reaction will typically develop differently in the switch channel. In general, the electrochemical reaction will develop from the direction of the delay reservoir towards the one of the source and drain contacts that is used as counter electrode. FIG. 3 illustrates the progress of an electrochemical reaction front in a device as described above with reference to FIG. 1a. In this example, the left-hand contact of the source and drain contacts, i.e. said first element, is used as counter electrode. The electrochemical reaction front in the electrochemically active element is illustrated in black, and the counter reaction occurring in the gate electrode is illustrated as a dashed segment. At time $t=t_1$, the electrochemical reaction in the delay reservoir is restricted to a small area close to the gate electrode, remote from said switch channel. Once the reaction process has stabilized, the reaction front will progress towards the switch channel, i.e. in a direction substantially parallel to said fourth direction, as illustrated at times t=$t_2$ and t=$t_3$. At time t=$t_3$, the reaction front is about to reach the switch channel, but it is still restricted to the delay reservoir and consequently does not essentially affect the electrical conductivity of the switch channel. However, at time t=$t_4$ the electrochemical reaction occupies the entire switch channel and thus switches the electrical conductivity thereof. Depending on the position of the counter electrode, the reaction front might even progress somewhat in the direction of the counter electrode (to the left of the switch channel in this example).

Figure 4:
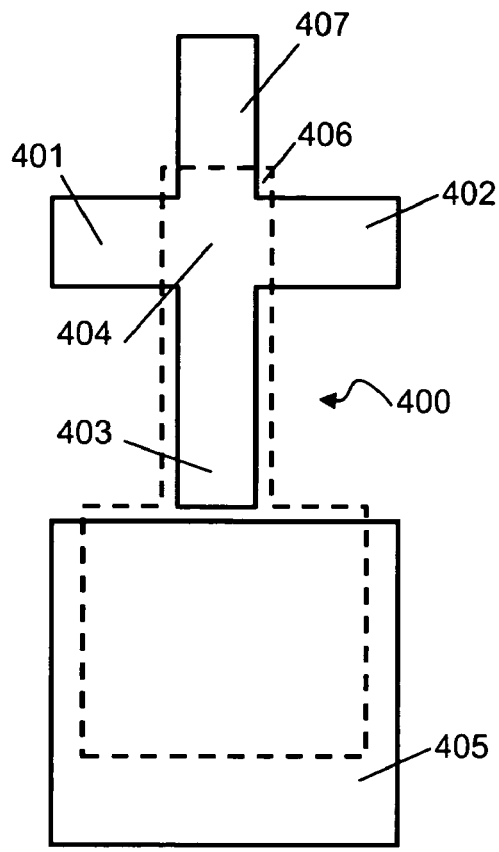
FIG. 4 illustrates an alternative embodiment of the present invention having two separate gate electrodes.

FIG. 4 illustrates an alternative embodiment having two separate gate electrodes. According to this embodiment, the electrochemical timer device 400 comprises a source contact 401, a drain contact 402, a delay reservoir 403, switch channel 404, electrolyte 406, and a first gate electrode 405 as described in relation to FIG. 1a. However, the device 400 furthermore comprises a second gate electrode 407, connected to said switch channel 404 and extending in said fourth direction. In other words, the first gate electrode 405 essentially corresponds to the gate electrode comprised in the devices described with reference to FIGS. 1a, 1b, and 1c, in the sense that it is covered by the electrolyte 406 and thus arranged to participate in the electrochemical reaction. In contrast, the second gate electrode is typically not covered by electrolyte and is consequently not arranged to participate in the electrochemical reaction. Instead, the purpose of the second gate electrode 407 is to serve as counter electrode when applying the electrochemical drive voltage. Thereby the electrochemical reaction in device 400 can be controlled without interfering with the potentials of the source and drain contacts. However, in complex circuits a common ground is typically required. In such case the additional gate electrode can be interconnected with either of the source or drain contacts turning the device 400 into a three-terminal device with an extra counter electrode. Nonetheless, the additional gate electrode will influence the switch characteristics of the device, thereby providing additional design freedom.

Figure 5:
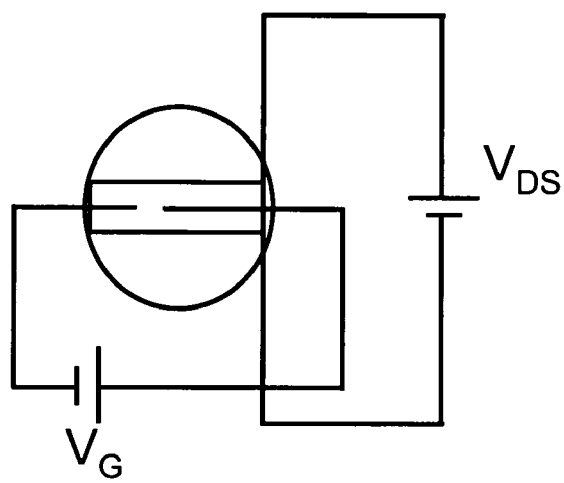
FIG. 5 illustrates a proposed symbol for use in circuitry diagrams, corresponding to the device illustrated in FIG. 4.

FIG. 5 illustrates a proposed symbol for use in circuitry diagrams, corresponding to the device illustrated in FIG. 4. In the symbol, $V_G$ corresponds to the gate voltage and $V_{DS}$ corresponds to the source-drain voltage.

Figure 6:
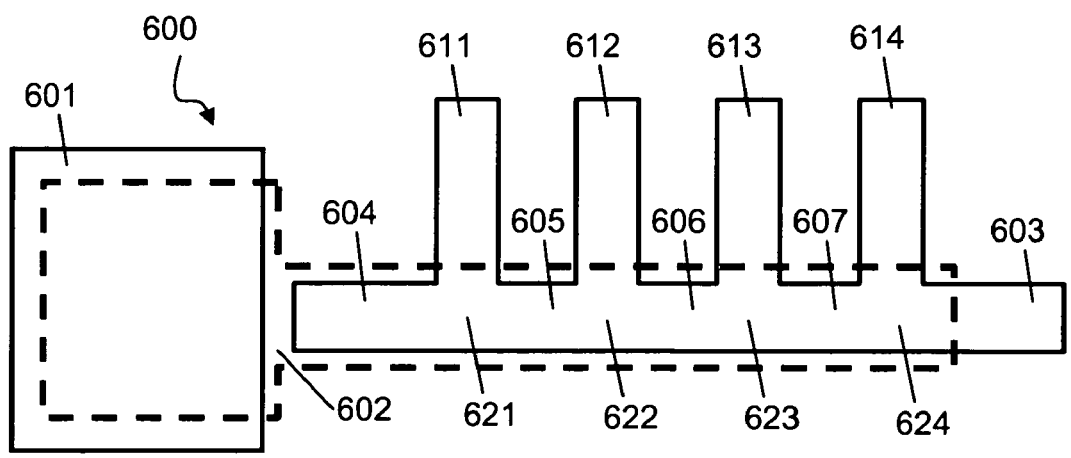
FIG. 6 illustrates yet one alternative embodiment having a number of drain contacts, each drain contact corresponding to a particular delay time.

According to an alternative design, as exemplified in FIG. 6, the device is provided with a number of drain contacts, and each drain contact corresponds to a particular delay time. Hence, FIG. 6 illustrates a timer switch 600 that comprises a gate electrode 601, an electrolyte 602, a source contact 603, a delay reservoir 604 and four different drain contacts 611, 612, 613, and 614. A first switch channel 621 is arranged in contact with a drain contact 611 which extends in said first direction from said switch channel. Said switch channel 611 is further arranged in contact with a first delay reservoir 604, which extends in said third direction from said switch channel, which direction is substantially orthogonal to said first direction. An additional delay reservoir 605 separates said first switch channel 621 from a second switch channel, which second switch channel is arranged in contact with a second drain contact 612, which extends in said first direction. A third switch reservoir 606 separates said second switch channel 622 form a third switch channel 623, which third switch channel 623 is connected to a third drain contact 613 extending in said first direction, and further switch channels 624 are arranged in the same way, such that all of said switch channels 621-624 and delay reservoirs 604-607 are alinged. Said source contact 604 is arranged in contact with the switch channel 624, which is most remotely arranged from said gate electrode 601, wherein said source contact extends in a fourth direction from said switch channel 624. An electrolyte is arranged such that it covers all of said delay reservoir 604-607, all of said switch channels 621-624 and a major portion of said gate electrode. In other words, the timer switch operates the same way as the timer switches that are described above with respect to the drain contact 611 that is arranged next to the delay reservoir 604. However, the consecutive drain contacts 612, 613, and 614 each have their own additional delay reservoir 605, 606, and 607, respectively. In effect, drain contact 612 that is next to the first drain contact 611 will experience an effective delay reservoir made up by the first delay reservoir 604, the first switch channel 621 and the second delay reservoir 605 in combination. Consequently, the delay time of the second drain contact 612 will be substantially longer than the delay time of the first drain contact 611. The longest delay time will be experienced by the fourth drain contact 614, having an effective delay reservoir made up by the first delay reservoir 604, the first switch channel 621, the second delay reservoir 605, the second switch channel, the third delay reservoir 606, the third switch channel 623, and the fourth delay reservoir 607 in combination. In other words, the fourth switch channel 624 will not switch until the fourth delay reservoir 607 are switched, in turn requiring all the preceding elements to switch.

Theoretical Operation

In the following, the expected theoretical operation of the present invention will be discussed. In the discussion, reference will be made to a device that is arranged such that an oxidation reaction in the electrochemically active element ends up switching the switch channel from an electrically conductive state to an electrically non-conductive state (i.e. an initially-open device).

A large potential (>1 V) applied across the gate electrode and the electrochemically active element causes oxidation to occur in the electrically active element. In case the process is ion transport limited (the electrolyte has a relatively low ion conductivity compared to the electrical conductivity of the electrochemically active element), an oxidation front develops in the delay reservoir at the edge closest to the gate. After an initial consumption of ions, the speed of the oxidation front is proportional to the current supplied to the device (which is also proportional to the net flux of charge in the electrolyte between the gate electrode and the delay reservoir). Thus, if the device is driven at a constant current the front will move at a constant velocity provided that the delay reservoir is uniform along the path of the oxidation front. However, if the device is instead driven at a constant potential V, then the oxidation front position will increase approximately as the square root of time (after the initial consumption of ions). This square root relation is mainly due to the gradually increasing resistance arising in the delay reservoir when it is electrochemically reacted.

It is presently assumed that this phenomenon can be explained as follows: The ion transport in the electrolyte follows Fick's law (with an additional term for electromigration):

$$j = -D\nabla c - z\mu c \nabla \phi$$

where j is the ionic flux, D is the diffusion coefficient, z is the charge of the mobile species (assumed to be a simple cation as in NaPSS), µ is the mobility, c is the ion concentration in the electrolyte and Φ is the potential within the electrolyte. Hence, decreasing the ion concentration c reduces the ion conductivity and thus promotes the appearance of a distinct reaction front in the device. In many cases the ionic flux will be dominated by electromigration, so only the second term must be considered. In such a case, the current is proportional to the gradient of the potential, which we will approximate as $\Delta\Phi/L$, where L is the distance between the edge of the delay reservoir and that is closes to the gate electrode and the front of the electrochemical reaction. The velocity of the front is then proportional to this current:

$$\frac{dL}{dt} = aj$$

where a is a constant. Putting the two together yields the differential equation:

$$\frac{dL}{dt} = \frac{b}{L}$$

where b is another constant and includes the applied potential $\Delta V$. The solution to this equation is:

$$L = \sqrt{2}\sqrt{bt+c_1}$$

where $c_1$ a constant that is equal to zero if L=0 at t=0. Thus, doubling the volume of the delay reservoir makes the device last approximately 4 times as long.

In case the ionic flux is instead dominated by diffusion, only the first term of Fick's law needs to be accounted for. Assuming that x is the coordinate along which L is measured, and that the ion concentration in the electrolyte above the gate is approximated by a constant $c_0$, the flux of ions in the electrolyte can be approximated as:

$$j = -D\frac{dc}{dx}$$

The concentration of ions is approximately zero at the reaction front since it is the concentration of ions that limits the electrochemical reaction at the reaction front. Thereby the term dc/dx can be approximated as $(0-c_0)/L$ giving:

$$j \approx D\frac{c_0}{L}$$

As with the electromigration model proposed above, $$\frac{dL}{dt} = aj$$

where a is a constant. Substituting for j gives:

$$\frac{dL}{dt} = aD\frac{c_0}{L}$$

Considering $aDc_0$ to be a constant like b in the electromigration model, the same differential equation (and solution) is found:

$$L = \sqrt{2}\sqrt{aDc_0t+c_1}$$

In general, the delay time is influenced by the following parameters:

The length and volume of the delay reservoir. The greater the length and/or the volume of the delay reservoir, the longer the delay time until the switch channel switches.

The magnitude of the applied gate voltage. The lower the voltage, the longer the delay time until the switch channel switches.

The size and layout of the gate electrode. The gate electrode much be large enough, such that it provides enough ions for the electrochemical reaction, propagating in said delay reservoir, to be able to reach said switch channel. If the gate electrode has an elongated shape, and is arranged such that it essentially is an extension of said delay reservoir, although gate and reservoir are separated from each other, the delay time until the switch channel switches will be slightly longer; compared to if the gate electrode is arranged at an angle to said delay reservoir. This is due to the fact that as the ions are consumed in the area closest to the gate electrode, they will have to pass a longer and longer distance from the gate electrode to the delay reservoir. This prolonged distance is the longest when said gate electrode is arranged as an extension of said delay reservoir. Conclusively, this switching time will be somewhat longer.

Different types of electrolytes having different ion mobility u and ion diffusion D and hence allowing for ion-dependent timer switches. The lower the ion mobility, the longer the delay time until the switch channel switches.

Furthermore, as stated above, the delay time can depend on environmental changes thereby giving the timer switch a sensor function. For example, a lower pH-value has been shown to depress over-oxidation, thereby enabling pH-dependent timer switches. Increased temperature results in increased ionic conductivity and therefore decreased time, thereby enabling temperature dependent timer switches.

Increased humidity results in increased water content in the electrolyte, which increases the ionic conductivity and decreases the delay time thereby enabling humidity dependent delay times. These environmental dependencies can be eliminated by encapsulating the electrolyte.

Materials

In the following, materials that can be used for the different components of the present invention are described and exemplified.

Electrolytes

The electrolyte can be formed out of many different compounds. A general requirement is that the electrolyte should have a sufficiently low ion conductivity and ion concentration not to deteriorate the timer characteristics by allowing premature electrochemical reaction in the switch channel. One particular electrolyte suitable for application in a separate layer is EG010, which is a mixture of 33 wt.-% poly(sodium 4-styrenesulfonate) (also called PSS, MW 70000 Aldrich), 8 wt.-% glycerol (87%, Merck), and 8 wt.-% D-sorbitol (97%, Lancaster) in deionized water. The ion conductivity of EG010 can be reduced by adding for example an UV-curable lacquer or by decreasing the amount of PSS, which can be done by adding different kinds of water soluble polymers that do not give off ions when dissolved. The ion conductivity can also be reduced by adding sand in the electrolyte, or various binders that are discussed below. Another suitable electrolyte is polyethyleneglycol.

In case the electrolyte is applied as a separate layer using for example printing techniques, it should preferably have the ability of solidifying upon application. In such case the electrolyte can include a binder that has gelling properties. The binder is preferably selected from the group consisting of gelatine, a gelatine derivative, polyacrylic acid, polymethacrylic acid, poly(vinyl-pyrrolidone), polysaccharides, polyacrylamides, polyurethanes, polypropylene oxides, polyethylene oxides, poly-(styrene sulphonic acid) and poly (vinyl alcohol) and salts and copolymers thereof; and may optionally be cross-linked. The solidifying electrolyte preferably further comprises an ionic salt, preferably magnesium sulphate if the binder employed is gelatine. The solidifying electrolyte preferably further contains a hygroscopic salt such as magnesium chloride to maintain the water content therein and hence to reduce the dependency of the delay time on the surrounding humidity.

Electrochemically Active Material

The organic material for use in the present invention may comprise a polymer that is electrically conducting in at least one oxidation state and optionally further comprises a polyanion compound. Organic materials comprising combinations of more than one polymer material, such as polymer blends, or several layers of polymer materials, wherein the different layers consist of the same polymer or different polymers, are also contemplated. Conductive polymers for use in the electrochemical timer device of the invention are preferably selected from the group consisting of polythiophenes, polypyrroles, polyanilines, polyisothianaphthalenes, polyphenylene vinylenes and copolymers thereof. At present, PEDOT:PSS (PEDOT (poly (3,4-ethylenedioxythiophene)) doped with PSS (poly (styrene sulphonate))) is found suitable and is used in a number of applications. P3HT (poly (3-hexylthiophene)) is also found useful.

Some electrically conductive polymers suitable for use in the present invention are susceptible to so-called over-oxidation, rendering them electrically non-conductive in a permanently oxidised state. Polythiophenes are one example of such polymers. Over-oxidation is an irreversible process, and devices based on over-oxidation are appropriate for single use only. In other words, when over-oxidation is used for controlling the switching the switch channel, an overoxidation front propagates in said delay reservoir, normally from the portion of said reservoir which is arranged closest to said gate and towards said switch channel. With respect to this invention, the term overoxidation front should be interpreted such that when said overoxidation front has passed across a portion of said delay reservoir, the electrical conductivity of this portion is rendered permanently non-conductive. However, by using a reduction front in such polymers instead, the device can be used multiple times by allowing them to switch back to the ground state after each run provided that switching back is performed without over-oxidation. During such switching cycles, the impedance of the switch channel is typically changed several orders of magnitude.

It is also possible to use non-organic electrochemically active materials. Examples of such materials include metal oxides such as $WO_3$, $Ni(OH)_2$, $IrO_2$, $Nb_2O_5$ and $MoO_3$ are some examples that could be used in EC-transistors, therefore it should also be possible to use them in an EC-timer.

Carrier Substrate

The timer device can be supported or self-supporting. Supported devices are typically arranged on a substrate comprising a material selected from the group consisting of polyethylene terephthalate; polyethylene naphthalene dicarboxylate; polyethylene; polypropylene; paper; coated paper, e.g. coated with resins, polyethylene, or polypropylene; paper laminates; paperboard; corrugated board; glass and polycarbonate. Alternatively, rigid substrates can be formed from e.g. glass substrates.

Manufacturing

The electrochemical timer switch can be manufactured using many different methods. In fact, a general advantage with the timer switch according to the present invention is that it can be manufactured using the same materials, equipment, and methods as are used for other known electrochemically based electronic devices, such as the transistors described in US-20040211989. Hence, the different components of the timer can be deposited on the carrier substrate by means of conventional printing techniques such as screen printing, offset printing, ink-jet printing and flexographic printing, or coating techniques such as knife coating, doctor blade coating, extrusion coating and curtain coating, such as described in "Modern Coating and Drying Technology" (1992), eds E D Cohen and E B Gutoff, VCH Publishers Inc, New York, N.Y., USA. In those embodiments of the invention that utilise a conducting polymer as the organic material (see below for materials specifications), this material can also be deposited through in situ polymerisation by methods such as electropolymerisation, UV-polymerisation, thermal polymerisation and chemical polymerisation. As an alternative to these additive techniques for patterning of the components, it is also possible to use subtractive techniques, such as local destruction of material through chemical or gas etching, by mechanical means such as scratching, scoring, scraping or milling, or by any other subtractive methods known in the art. An aspect of the invention provides such processes for the manufacture of an electrochemical transistor device from the materials specified herein.

EXPERIMENTS

Measurements on timers in which the delay reservoir length was varied have been performed. The results presented below concerns both oxidation front and reduction front timers. For both cases, EG010 was used as electrolyte.

The devices were formed out of Orgacon™ EL that is commercially available from AGFA-Gaevert. Orgacon™ EL is a polyethylene foil coated with 0.2 μm PEDOT:PSS. The PEDOT:PSS layer was patterned with a knife mounted in the penholder of a plotter table. The electrolyte was applied in a three-step procedure. First, a conventional plastic lamination foil was patterned with a knife cutting up openings corresponding to areas where the electrolyte should be applied to the PEDOT:PSS layer. Thereafter the plastic foil was laminated onto the PEDOT:PSS layer. Finally the electrolyte was drop cast in the openings of the plastic foil resulting in an approximately 100 μm thick layer of electrolyte.

In the experiments performed, the delay reservoir length (the distance between the gate and the channel) was 1, 2, 4, 6 and 10 mm (1.5; 2.5; 4.5; 6.5 and 10.5 mm including the width of the switch channel which was constant at 0.5 mm). The gate area covered with electrolyte was always 20 times larger than the sum of the delay reservoir and switch channel area (this ratio was held constant by changing the area of the gate electrode that was covered with electrolyte). The width of the delay reservoir and the length of the switch channel was 1 mm. Of each delay reservoir length, five equal components were processed in every 'batch'.

Figure 7:
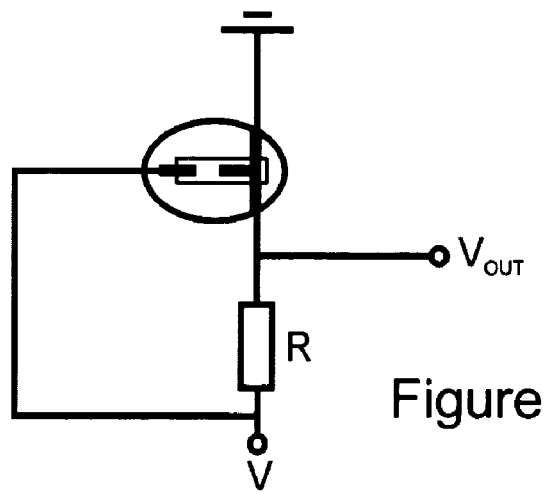
FIG. 7 illustrates an experimental setup of the timer device in accordance with the present invention.

FIG. 7 illustrates how the timers were connected electrically in the measurements. The resistor R was ~100 kΩ (much larger (smaller) compared to the impedance of the channel when the timer is 'on' ('off')), made of PEDOT and integrated in the design in the form of a resistor path. The applied voltage V (−3V in the case of over-oxidation front and +3V in the case of reduction front) was supplied by a Keithley source meter. The potential over the resistor ($V_{OUT}$) was measured using a DAQ card (Data AcQuisition card), enabling 16 separate timers to be measured at the same time making up an experiment series. For each experiment series, all timers with a specific reservoir length were measured at the same time to avoid external variations over time such as variations in humidity and temperature.

Experiment 1

Oxidation Front Timer

Figure 8:
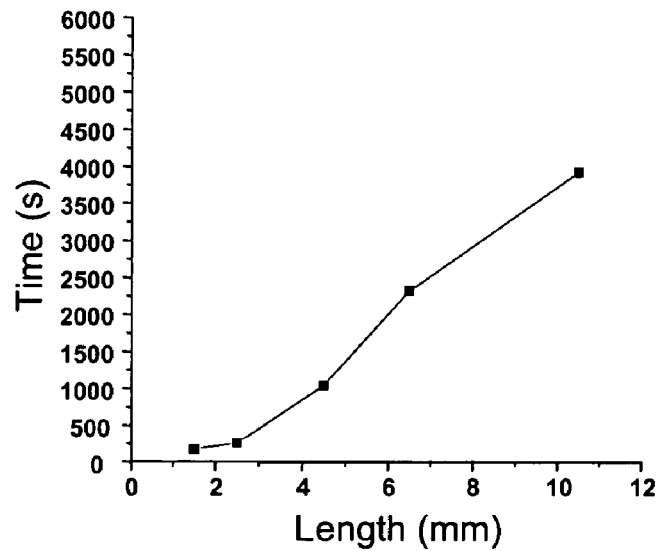
FIGS. 8 and 9 are a graphs showing delay times corresponding to different timer setups.

In this experiment, over-oxidation (V=−3V) was used to switch the switch channel and EG010 was used as electrolyte. In FIG. 8, mean times for when the timers switched are shown for different reservoir lengths. The times for the switches for each individual timer, the mean of the time for switch, the standard deviation and the standard error for all timers of each reservoir length are summarized below in Table 1.

TABLE 1

| Length [mm] | Time dev. 1 [s] | Time dev. 2 [s] | Time dev. 3 [s] | Time dev. 4 [s] | Time dev. 5 [s] | Mean value [s] | Standard deviation | Standard error |
|---|---|---|---|---|---|---|---|---|
| 1.5 | 244 | 122 | 180 | 169 | 157 | 174.4 | 44.6 | 0.25568 |
| 2.5 | 347 | 212 | 252 | 240 | 241 | 258.4 | 51.7 | 0.20002 |
| 4.5 | 1336 | 1036 | 968 | 1000 | 872 | 1042.4 | 175.1 | 0.16796 |
| 6.5 | 2388 | 2256 | 2196 | 2420 | — | 2315 | 106.5 | 0.04598 |
| 10.5 | 3368 | 3676 | 4708 | 3724 | 4128 | 3920.8 | 516.4 | 0.13172 |

Experiment 2

Reduction Front Timers

Figure 9:
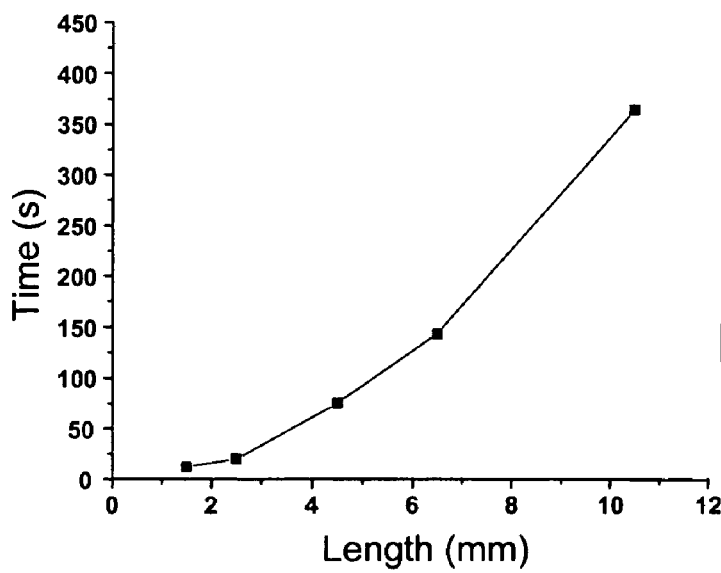

In this experiment, reduction (V=3V) was used to switch the channel and EG010 was used as electrolyte. FIG. 9 and Table 2 below presents measured switching times for devices having the same the delay reservoir lengths as used in Experiment 1. From FIG. 9 and Table 2 it is possible to conclude that the delay times are substantially shorter using a reduction compared to devices using a over-oxidation front. Furthermore, compared to timers based on over-oxidation, the slope from on to off, i.e. how fast the timers switches from on to off, was slower for reduction front timers.

TABLE 2

| Length [mm] | Time dev. 1 [s] | Time dev. 2 [s] | Time dev. 3 [s] | Time dev. 4 [s] | Time dev. 5 [s] | Mean value [s] | Standard deviation | Standard error |
|---|---|---|---|---|---|---|---|---|
| 1.5 | 15.25 | 10.5 | 8.75 | 11.75 | 13.5 | 12.0 | 2.5 | 0.21201 |
| 2.5 | 18 | 30.5 | 21.5 | 9.75 | — | 19.9 | 8.6 | 0.43102 |
| 4.5 | 67.5 | 78 | 71 | 78.5 | 81.5 | 75.3 | 5.8 | 0.07724 |
| 6.5 | 149 | 124 | 160.5 | 139 | — | 143.1 | 15.5 | 0.10818 |
| 10.5 | 325 | 328 | 426.5 | 377.5 | — | 364.3 | 48.0 | 0.13171 |

Experiment 3

Oxidation Front Timers

Figure 10:
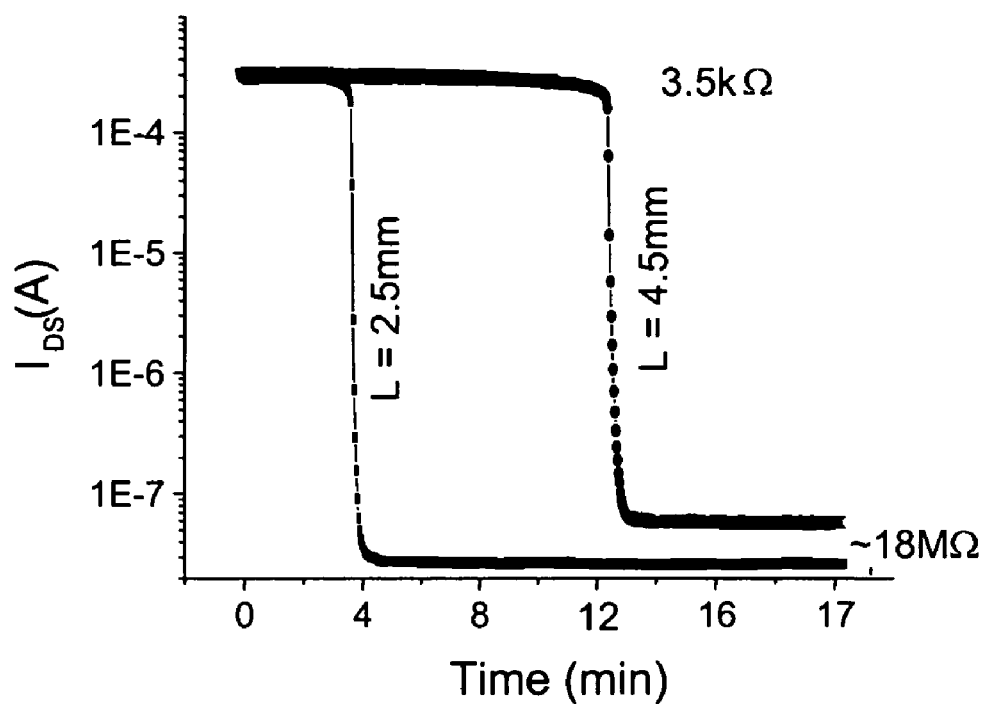
FIG. 10 is a graph showing the change of impedance in a timer having L=2.5 mm and in a timer having L=4.5 mm.

Two different delay reservoir lengths were tested with EG010 as electrolyte and delay reservoir lengths of 2.5 mm and 4.5 mm respectively. The timers were exposed to a source voltage of 4V and a gate voltage of 1V (thereby providing an over-oxidation front). FIG. 10 presents the change of impedance in timers having L=2.5 mm and in timers having L=4.5 mm. As is evident from FIG. 10, switching from low impedance (3.5 kΩ) to high impedance (18 MΩ) is at least 3 orders of magnitude, which is clearly sufficient for transistor logic and many other applications. The switching time (i.e. the time it takes for the actual switch channel to switch) is less than 10% of the time-delay for the short time delays shown above, thereby providing step-like switching characteristics.

The invention claimed is:

1. A method of delaying switching of an electrochemical switch channel, including an electrochemically active material, which electrically connects a source electrode to a drain electrode and is in contact with a delay reservoir including an electrochemically active material, the method comprising:

applying a potential across an electrolyte, wherein said electrolyte ionically connects both said delay reservoir and said switch channel to a gate electrode, such that an electrochemical reaction between said delay reservoir and said gate electrode is initiated; and maintaining a potential across said electrolyte such that a front of said electrochemical reaction first propagates in said delay reservoir until said front reaches said switch channel, before said electrochemical reaction alters the electrical conductivity of said switch channel such that said switch channel switches.

2. The method according to claim 1, wherein said electrochemical reaction alters the electrical conductivity of said switch channel by at least 50%.

3. The method according to claim 1, further comprising:
providing a first electrical conductivity of said switch channel before or while said front of said electrochemical reaction propagates in said delay reservoir towards said switch channel, wherein
said maintaining a potential across said electrolyte further includes preventing said switch channel from switching until said front of said electrochemical reaction reaches said switch channel, such that said first electrical conductivity of said switch channel is substantially maintained until said electrochemical reaction switches said switch channel.

4. The method according to claim 3, wherein said providing a first electrical conductivity of said switch channel includes providing said first electrical conductivity immediately after an initiation phase of said switch channel.

5. The method according to claim 4, wherein said applying a potential across said electrolyte further includes providing a redox reaction between said gate electrode and at least one of said delay reservoir and said switch channel.

6. The method according to claim 5, wherein said providing a redox reaction further includes over-oxidating said electrochemically active material in at least one of said delay reservoir and said switch channel.

7. The method according to claim 6, wherein said delay reservoir is arranged between said gate electrode and said switch channel, such that said applying a potential across said electrolyte further includes initiating said electrochemical reaction in a portion of said delay reservoir which is arranged remote from said switch channel.

8. An electrochemical switch for delayed switching comprising:
a source contact;
a drain contact;
a switch channel including an electrochemically active material electrically connecting said source contact to said drain contact;
a delay reservoir including electrochemically active material in contact with said switch channel;
a gate electrode;
an electrolyte ionically connecting both said switch channel and said delay reservoir to said gate electrode;
an application circuit configured to apply a potential across said electrolyte such that an electrochemical reaction between said delay reservoir and said gate electrode is initiated;
a maintenance circuit configured to maintain a potential across said electrolyte such that a front of said electrochemical reaction first propagates in said delay reservoir until said front reaches said switch channel before said electrochemical reaction alters the electrical conductivity of said switch channel such that said switch channel switches.

9. The switch according to claim 8, wherein said electrochemical reaction alters the electrical conductivity of said channel by at least 50%.

10. The switch according to claim 8, wherein
said switch channel has a first electrical conductivity while said front of said electrochemical reaction propagates in said delay reservoir towards said switch channel; and
said switch further includes a preventing circuit configured to prevent said switch channel from switching until said front of said electrochemical reaction reaches said switch channel, such that said first electrical conductivity of said switch channel is substantially maintained until said electrochemical reaction switches said switch channel.

11. The switch according to claim 8, wherein said delay reservoir is between said gate electrode and said switch channel, such that said electrochemical reaction is initiated in a portion of said delay reservoir which is remote from said switch channel.

12. The switch according to claim 8, wherein said delay reservoir has an electrical conductivity and said electrolyte has an ionic conductivity that is lower than said electrical conductivity of said delay reservoir.

13. The switch according to claim 8, wherein said electrochemical reaction is a redox reaction.

14. The switch according to claim 13, wherein said redox reaction includes an over-oxidation front which propagates in said delay reservoir towards said switch channel.

15. The switch according to claim 8, wherein
a unitary element of an electrically conductive polymer are said source contact, drain contact, switch channel and delay reservoir.

16. The switch according to claim 15, wherein said gate electrode includes an electrically conductive polymer.

17. The switch according to claim 8, wherein said source contact, drain contact, switch channel, delay reservoir and gate electrode are all arranged on a carrier substrate.

18. The switch according to claim 8, wherein said electrolyte is a layer arranged in contact with said switch channel and said delay reservoir.

19. An electrochemical timer switch comprising:
a source contact;
a drain contact;
a gate electrode;
an electrochemically active element defining a delay reservoir and a switch channel; and
an electrolyte being in contact with the electrochemically active element and the gate electrode thereby facilitating an electrochemical reaction between the electrochemically active element and the gate electrode, wherein
said switch channel is between, and in contact with, said source and drain contacts and having the ability of altering electrical conductivity through said electrochemical reaction, and
said delay reservoir separates said switch channel from said gate electrode thereby preventing the switch channel from participating in said electrochemical reaction unless the delay reservoir is first electrochemically reacted.

20. The electrochemical timer switch according to claim 19, wherein
said delay reservoir having an electrical conductivity and said electrolyte having an ionic conductivity that is lower than said electrical conductivity of said delay reservoir, and
said electrochemical reaction is forced to occur gradually in a front travelling in said delay reservoir in a direction from said gate electrode towards said switch channel.

21. The electrochemical timer switch according to claim 19, wherein the electrical conductivity of the switch channel is reduced upon said electrochemical reaction.

22. The electrochemical timer switch according to claim 19, wherein the electrical conductivity of the switch channel increases upon said electrochemical reaction.

23. The electrochemical timer switch according to claim 19, wherein the switch channel has the ability to alter electrical conductivity through the reduction thereof.

24. The electrochemical timer switch according to claim 19, wherein the switch channel has the ability to alter electrical conductivity through the oxidation thereof.

25. The electrochemical timer switch according to claim 19, wherein said source contact, drain contact, and electrochemically active element, are an integral unit of an electrically conductive polymer.

26. The electrochemical timer switch according to claim 19, wherein said gate electrode is formed out of an electrically conductive polymer.

27. The electrochemical timer switch according to claim 19, wherein said source contact, drain contact, electrochemically active element, and gate electrode are all on a carrier substrate.

28. The electrochemical timer switch according to claim 19, wherein said electrolyte is in a layer covering portions of said gate electrode and said electrochemically active element.

29. The electrochemical timer switch according to claim 19, further comprising a counter electrode electrically connected to said electrochemically active element and separate from said source and drain contacts.

30. The electrochemical timer switch according to claim 19, further comprising:

a second drain contact, wherein said electrochemically active element further includes a second switch channel to separate said second drain contact from said source contact.

* * * * *